US011461269B2

(12) United States Patent
Liang et al.

(10) Patent No.: US 11,461,269 B2
(45) Date of Patent: Oct. 4, 2022

(54) METADATA SEPARATED CONTAINER FORMAT

(71) Applicant: EMC IP Holding Company LLC, Hopkinton, MA (US)

(72) Inventors: Shuang Liang, Los Altos, CA (US); Mahesh Kamat, San Jose, CA (US); Bhimsen Bhanjois, Fremont, CA (US)

(73) Assignee: EMC IP HOLDING COMPANY, Hopkinton, MA (US)

(*) Notice: Subject to any disclaimer, the term of this patent is extended or adjusted under 35 U.S.C. 154(b) by 724 days.

(21) Appl. No.: 15/656,338

(22) Filed: Jul. 21, 2017

(65) Prior Publication Data
US 2019/0026299 A1 Jan. 24, 2019

(51) Int. Cl.
G06F 16/13 (2019.01)
G06F 16/16 (2019.01)
H03M 7/30 (2006.01)
G06F 3/06 (2006.01)
G06F 16/174 (2019.01)

(52) U.S. Cl.
CPC ............ G06F 16/13 (2019.01); G06F 3/0608 (2013.01); G06F 3/0641 (2013.01); G06F 3/0673 (2013.01); G06F 16/164 (2019.01); G06F 16/1752 (2019.01); H03M 7/3064 (2013.01); H03M 7/3091 (2013.01); H03M 7/3095 (2013.01)

(58) Field of Classification Search
CPC ...... G06F 16/13; G06F 3/0608; G06F 3/0641; G06F 3/0673; G06F 16/164; G06F 16/1752; G06F 17/30091; G06F 17/3012; H03M 7/3064; H03M 7/3091; H03M 7/3095
See application file for complete search history.

(56) References Cited

U.S. PATENT DOCUMENTS 6,928,526 B1 8/2005 Zhu et al.
7,085,911 B2 8/2006 Sachedina et al.
7,818,515 B1 10/2010 Umbehocker et al.
8,046,551 B1 10/2011 Sahin
(Continued)

FOREIGN PATENT DOCUMENTS

CN 102880663 A 1/2013
CN 104010042 A 8/2014
(Continued)

OTHER PUBLICATIONS

J. Min, D. Yoon and Y. Won, "Efficient Deduplication Techniques for Modern Backup Operation," in IEEE Transactions on Computers, vol. 60, No. 6, pp. 824-840, Jun. 2011.*
(Continued)

Primary Examiner — Mark D Featherstone
Assistant Examiner — Samuel C Sharpless, III
(74) Attorney, Agent, or Firm — Chamberlain, Hrdlicka, White, Williams & Aughtry

(57) ABSTRACT

A data management device includes a persistent storage and a processor. The persistent storage includes an object storage. The processor segments a file into file segments. The processor generates meta-data of the file segments. The processor stores a portion of the file segments in a data object of the object storage. The processor stores a portion of the meta-data of the file segments in a meta-data object of the object storage.

18 Claims, 14 Drawing Sheets

(56) References Cited

U.S. PATENT DOCUMENTS

| | | | |
|---|---|---|---|
| 8,190,835 B1 | 5/2012 | Yueh | |
| 8,204,868 B1 | 6/2012 | Wu et al. | |
| 8,396,841 B1 | 3/2013 | Janakiraman | |
| 8,577,850 B1 | 11/2013 | Genda et al. | |
| 8,700,578 B1* | 4/2014 | Varadan | G06F 16/174 707/692 |
| 8,732,403 B1 | 5/2014 | Nayak | |
| 8,782,323 B2 | 7/2014 | Glikson et al. | |
| 8,898,114 B1 | 11/2014 | Feathergill et al. | |
| 8,898,120 B1 | 11/2014 | Efstathopoulos | |
| 8,904,120 B1 | 12/2014 | Killammsetti et al. | |
| 8,918,390 B1 | 12/2014 | Shilane et al. | |
| 8,943,032 B1 | 1/2015 | Xu et al. | |
| 8,949,208 B1 | 2/2015 | Xu et al. | |
| 9,183,200 B1 | 11/2015 | Liu et al. | |
| 9,244,623 B1 | 1/2016 | Bent et al. | |
| 9,250,823 B1 | 2/2016 | Kamat et al. | |
| 9,251,160 B1 | 2/2016 | Wartnick | |
| 9,274,954 B1 | 3/2016 | Bairavasundaram et al. | |
| 9,280,550 B1 | 3/2016 | Hsu et al. | |
| 9,298,724 B1 | 3/2016 | Patil et al. | |
| 9,317,218 B1 | 4/2016 | Botelho et al. | |
| 9,336,143 B1 | 5/2016 | Wallace et al. | |
| 9,390,116 B1 | 7/2016 | Li et al. | |
| 9,390,281 B2 | 7/2016 | Whaley et al. | |
| 9,424,185 B1 | 8/2016 | Botelho et al. | |
| 9,442,671 B1 | 9/2016 | Zhang et al. | |
| 9,830,111 B1 | 11/2017 | Patiejunas et al. | |
| 9,952,933 B1* | 4/2018 | Zhang | G06F 11/1453 |
| 10,002,048 B2 | 6/2018 | Chennamsetty et al. | |
| 10,031,672 B2 | 7/2018 | Wang et al. | |
| 10,078,451 B1 | 9/2018 | Floyd et al. | |
| 10,102,150 B1 | 10/2018 | Visvanathan et al. | |
| 10,175,894 B1 | 1/2019 | Visvanathan et al. | |
| 10,445,292 B1 | 10/2019 | Zhang et al. | |
| 2003/0110263 A1 | 6/2003 | Shillo | |
| 2005/0120058 A1 | 6/2005 | Nishio | |
| 2005/0160225 A1 | 7/2005 | Presler-Marshall | |
| 2005/0182906 A1 | 8/2005 | Chatterjee et al. | |
| 2006/0075191 A1 | 4/2006 | Lolayekar et al. | |
| 2008/0082727 A1 | 4/2008 | Wang | |
| 2008/0133446 A1 | 6/2008 | Dubnicki et al. | |
| 2008/0133561 A1 | 6/2008 | Dubnicki et al. | |
| 2008/0216086 A1 | 9/2008 | Tanaka et al. | |
| 2008/0244204 A1 | 10/2008 | Cremelie et al. | |
| 2009/0235115 A1 | 9/2009 | Butlin | |
| 2009/0271454 A1 | 10/2009 | Anglin et al. | |
| 2010/0049735 A1 | 2/2010 | Hou | |
| 2010/0094817 A1 | 4/2010 | Ben-Shaul et al. | |
| 2010/0250858 A1 | 9/2010 | Cremelie et al. | |
| 2011/0055471 A1 | 3/2011 | Thatcher et al. | |
| 2011/0099200 A1 | 4/2011 | Blount et al. | |
| 2011/0099351 A1 | 4/2011 | Condict | |
| 2011/0161557 A1 | 6/2011 | Haines et al. | |
| 2011/0185149 A1* | 7/2011 | Gruhl | G06F 3/0608 711/206 |
| 2011/0196869 A1* | 8/2011 | Patterson | G06F 3/0644 707/737 |
| 2011/0209064 A1 | 8/2011 | Jorgensen | |
| 2011/0231594 A1 | 9/2011 | Sugimoto et al. | |
| 2011/0276781 A1 | 11/2011 | Sengupta et al. | |
| 2012/0158670 A1 | 6/2012 | Sharma et al. | |
| 2012/0209873 A1 | 8/2012 | He | |
| 2012/0278511 A1 | 11/2012 | Alatorre et al. | |
| 2013/0036098 A1 | 2/2013 | Mutalik et al. | |
| 2013/0055018 A1 | 2/2013 | Joshi et al. | |
| 2013/0060739 A1 | 3/2013 | Kalach et al. | |
| 2013/0067080 A1 | 3/2013 | Shah et al. | |
| 2013/0111262 A1 | 5/2013 | Taylor et al. | |
| 2013/0138620 A1 | 5/2013 | Yakushev et al. | |
| 2014/0012822 A1 | 1/2014 | Sachedina et al. | |
| 2014/0040205 A1 | 2/2014 | Cometto et al. | |
| 2014/0044371 A1* | 2/2014 | Madanbashi | H04N 19/90 382/244 |
| 2014/0047181 A1 | 2/2014 | Peterson et al. | |
| 2014/0101113 A1 | 4/2014 | Zhang | |
| 2014/0195575 A1 | 7/2014 | Haustein et al. | |
| 2014/0201169 A1 | 7/2014 | Liu | |
| 2014/0258248 A1 | 9/2014 | Lambright et al. | |
| 2014/0258824 A1 | 9/2014 | Khosla et al. | |
| 2014/0281215 A1 | 9/2014 | Chen et al. | |
| 2014/0310476 A1 | 10/2014 | Kruus | |
| 2014/0325147 A1 | 10/2014 | Nayak | |
| 2015/0074679 A1 | 3/2015 | Fenoglio et al. | |
| 2015/0106345 A1 | 4/2015 | Trimble et al. | |
| 2015/0178171 A1 | 6/2015 | Bish et al. | |
| 2015/0331622 A1 | 11/2015 | Chiu et al. | |
| 2016/0026652 A1 | 1/2016 | Zheng | |
| 2016/0112475 A1 | 4/2016 | Lawson et al. | |
| 2016/0188589 A1 | 6/2016 | Guilford et al. | |
| 2016/0224274 A1 | 8/2016 | Kato | |
| 2016/0239222 A1 | 8/2016 | Shetty et al. | |
| 2016/0323367 A1 | 11/2016 | Murtha et al. | |
| 2016/0342338 A1 | 11/2016 | Wang | |
| 2017/0017907 A1 | 1/2017 | Narasimhan | |
| 2017/0093961 A1 | 3/2017 | Pacella et al. | |
| 2017/0199894 A1 | 7/2017 | Aronovich et al. | |
| 2017/0220281 A1 | 8/2017 | Gupta et al. | |
| 2017/0220334 A1 | 8/2017 | Hart et al. | |
| 2017/0300424 A1 | 10/2017 | Beaverson et al. | |
| 2017/0352038 A1 | 12/2017 | Parekh et al. | |
| 2017/0359411 A1 | 12/2017 | Burns et al. | |
| 2018/0089037 A1 | 3/2018 | Liu et al. | |
| 2018/0146068 A1 | 5/2018 | Johnston et al. | |
| 2018/0267896 A1 | 9/2018 | Zhang et al. | |
| 2018/0322062 A1 | 11/2018 | Watkins et al. | |

FOREIGN PATENT DOCUMENTS

| | | | | |
|---|---|---|---|---|
| EP | 2738665 A1 | 6/2014 | | |
| EP | 2810171 B1 | 7/2019 | | |
| WO | 2013056220 A1 | 4/2013 | | |
| WO | 2013115822 A1 | 8/2013 | | |
| WO | 2013165388 A1 | 11/2013 | | |
| WO | 2014185918 A1 | 11/2014 | | |
| WO | WO2017113123 | * | 6/2017 | G06F 12/0253 |

OTHER PUBLICATIONS

Aseem Kishore; "What is a Checksum and How to Calculate a Checksum"; Online Tech Tips; Feb. 18, 2015; https://www.online-tech-tips.com/cool-websites/what-is-checksum/.

International Search Report and Written Opinion issued in corresponding PCT Application PCT/US2018/027646, dated Jul. 27, 2018. (30 pages).

Deepavali Bhagwat et al.; "Extreme Binning: Scalable, Parallel Deduplication for Chunk-based File Backup"; IEEE MASCOTS; Sep. 2009 (10 pages).

Mark Lillibridge et al.; "Sparse Indexing: Large Scale, Inline Deduplication Using Sampling and Locality"; 7th USENIX Conference on File and Storage Technologies, USENIX Association; pp. 111-pp. 123; 2009 (13 pages).

Extended European Search Report issued in corresponding European Application No. 18185076.9, dated Dec. 7, 2018 (9 pages).

Lei Xu et al.; "SHHC: A Scalable Hybrid Hash Cluster for Cloud Backup Services in Data Center"; 2011 31st International Conference on Distributed Computing Systems Workshops (ICDCSW); IEEE Computer Society; pp. 61-65; 2011 (5 pages).

Extended European Search Report issued in corresponding European Application No. 18184842.5, dated Sep. 19, 2018.

Jaehong Min et al.; "Efficient Deduplication Techniques for Modern Backup Operation"; IEEE Transactions on Computers; vol. 60, No. 6; pp. 824-840; Jun. 2011.

Daehee Kim et al.; "Existing Deduplication Techniques"; Data Depublication for Data Optimization for Storage and Network Systems; Springer International Publishing; DOI: 10.1007/978-3-319-42280-0_2; pp. 23-76; Sep. 2016.

International Search Report and Written Opinion issued in corresponding WO application No. PCT/US2018/027642, dated Jun. 7, 2018 (15 pages).

(56) References Cited

OTHER PUBLICATIONS

Yan-Kit Li et al, Efficient Hybrid Inline and Out-of-Line Deduplication for Backup Storage, Dec. 29, 2014, pp. 1-21, vol. 11.

* cited by examiner

METADATA SEPARATED CONTAINER FORMAT

BACKGROUND

Computing devices generate, use, and store data. The data may be, for example, images, document, webpages, or meta-data associated with any of the files. The data may be stored locally on a persistent storage of a computing device and/or may be stored remotely on a persistent storage of another computing device.

SUMMARY

In one aspect, a data management device in accordance with one or more embodiments of the invention includes a persistent storage including an object storage and a processor. The processor segments a file into file segments, generates meta-data of the file segments, stores a portion of the file segments in a data object of the object storage, and stores a portion of the meta-data of the file segments in a meta-data object of the object storage.

In one aspect, a method of operating a data management device in accordance with one or more embodiments of the invention includes segmenting, by the data management device, a file into file segments; generating, by the data management device, meta-data of the file segments; storing, by the data management device, a portion of the file segments in a data object of an object storage; and storing, by the data management device, meta-data of file segments in a meta-data object of the object storage.

In one aspect, a non-transitory computer readable medium in accordance with one or more embodiments of the invention includes computer readable program code, which when executed by a computer processor enables the computer processor to perform a method for operating a data management device, the method includes segmenting, by the data management device, a file into file segments; generating, by the data management device, meta-data of the file segments; storing, by the data management device, a portion of the file segments in a data object of an object storage; and storing, by the data management device, meta-data of file segments in a meta-data object of the object storage

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Figure 1A:
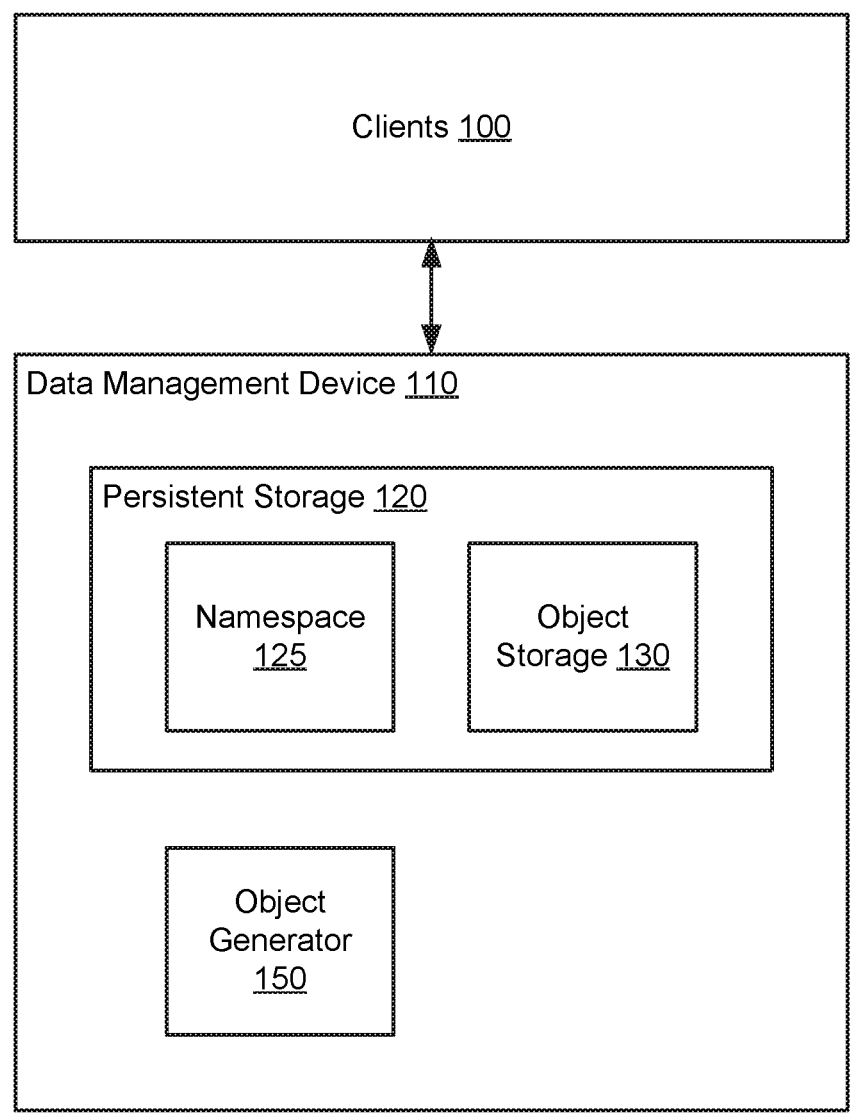
FIG. 1A shows a diagram of a system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing data. More specifically, the systems, devices, and methods may reduce the amount of storage required to store data.

In one or more embodiments of the invention, a data management device may include an object storage. The object storage may store two different types of object. The first type is a data object that stored portions of files. Files may be divided into segments and the segments may be stored in one or more data objects. The second type is a meta-data object that stores information related to the portions of the files stored in data objects. The information related to the portion, e.g., the segments, of the files stored in the meta-data objects may include fingerprints of the portions of the files, e.g., fingerprints of the segments, and the size of the portions of the files and/or the files stored in the data objects.

In one or more embodiments of the invention, the object storage may be a deduplicate storage. Data to-be-stored in the object storage may be deduplicated, before storage, by dividing the to-be-stored data into file segments, identifying file segments that are duplicates of file segments already stored in the object storage, deleting the identified duplicate file segments, and storing the remaining file segments in data objects of the object storage. Meta-data corresponding to the now-stored file segments may be stored in meta-data objects of the object storage. Removing the duplicate file segments may reduce the quantity of storage required to store the to-be-stored data when compared to the quantity of storage space required to store the to-be-stored data without being deduplicated.

FIG. 1 shows a system in accordance with one or more embodiments of the invention. The system may include clients (100) that store data in the data management device (110). The clients (100) and data management device (110) may be operably connected to each other. Each component of the system is discussed below.

The clients (100) may be computing devices. The computing device may be, for example, a mobile phone, a tablet computer, a laptop computer, a desktop computer, a server, or a cloud resource. The computing device may include one or more processors, memory (e.g., random access memory), and persistent storage (e.g., disk drives, solid state drives, etc.). The persistent storage may store computer instructions, e.g., computer code, that when executed by the processor(s) of the computing device cause the computing device to perform the functions described in this. The data management device (110) may be other types of computing devices without departing from the invention.

The clients (100) may be programmed to stored data in the data management device (110). More specifically, the clients (100) may send data to the data management device (110) for storage and may request data managed by the data management device (110). The data management device (110) may store the data or provide the requested data in response to such requests.

The data management device (110) may be a computing device. The computing device may be, for example, a mobile phone, a tablet computer, a laptop computer, a desktop computer, a server, or a cloud resource. The computing device may include one or more processors, memory (e.g., random access memory), and persistent storage (e.g., disk drives, solid state drives, etc.). The persistent storage may store computer instructions, e.g., computer code, that when executed by the processor(s) of the computing device cause the computing device to perform the functions described in this application and illustrated in at least FIGS. 4A-4E. The data management device (110) may be other types of computing devices without departing from the invention.

The data management device (110) may include a persistent storage (120) and an object generator. Each component of the data management device (110) is discussed below.

The data management device (110) may include a persistent storage (120). The persistent storage (120) may include physical storage devices. The physical storage devices may be, for example, hard disk drives, solid state drives, tape drives that support random access, or any other type of persistent storage media. The persistent storage (120) may include any number and/or combination of physical storage devices.

The persistent storage (120) may include an object storage (130) for storing data from the clients (100). As used herein, an object storage is a data storage architecture that manages data as objects. Each object may include a number of bytes for storing data in the object. In one or more embodiments of the invention, the object storage does not include a file system. Rather, a namespace (125) may be used to organize the data stored in the object storage. For additional details regarding the object storage (130), see FIG. 1B.

The persistent storage (120) may include the namespace (125). The namespace (125) may be a data structure stored on physical storage devices of the persistent storage (120) that organizes the data storage resources of the physical storage devices.

In one or more embodiments of the invention, the namespace (125) may associate a file with a file recipe stored in the persistent storage. The file recipe may be used to generate a file stored in the object storage (130) using file segments stored in the object storage (130). Each file recipe may include information that enables a number of file segments to be retrieved from the object storage. The retrieved file segments may then be used to generate the file stored in the object storage. For additional details regarding file segments, See FIGS. 2A, 3A, and 3B.

The data management may include an object generator (150). The object generator (150) may generate objects stored in the object storage (130). The object generator (150) may generate different types of objects. More specifically, the object generator (150) may generate data objects that store file segments and meta-data objects that store meta-data regarding file segments stored in data objects. For additional details regarding data objects and meta-data objects, See FIGS. 2A-2D.

In one or more embodiments of the invention, the object generator (150) may be a physical device. The physical device may include circuitry. The physical device may be, for example, a field-programmable gate array, application specific integrated circuit, programmable processor, microcontroller, digital signal processor, or other hardware processor. The physical device may be adapted to provide the functionality described in this application and to perform the methods shown in FIGS. 4A-4E.

In one or more embodiments of the invention, the object generator (150) may be implemented as computer instructions, e.g., computer code, stored on a persistent storage that when executed by a processor of the data management device (110) cause the data management device (110) to provide the functionality described throughout this application and to perform the methods shown in FIGS. 4A-4E.

Figure 1B:
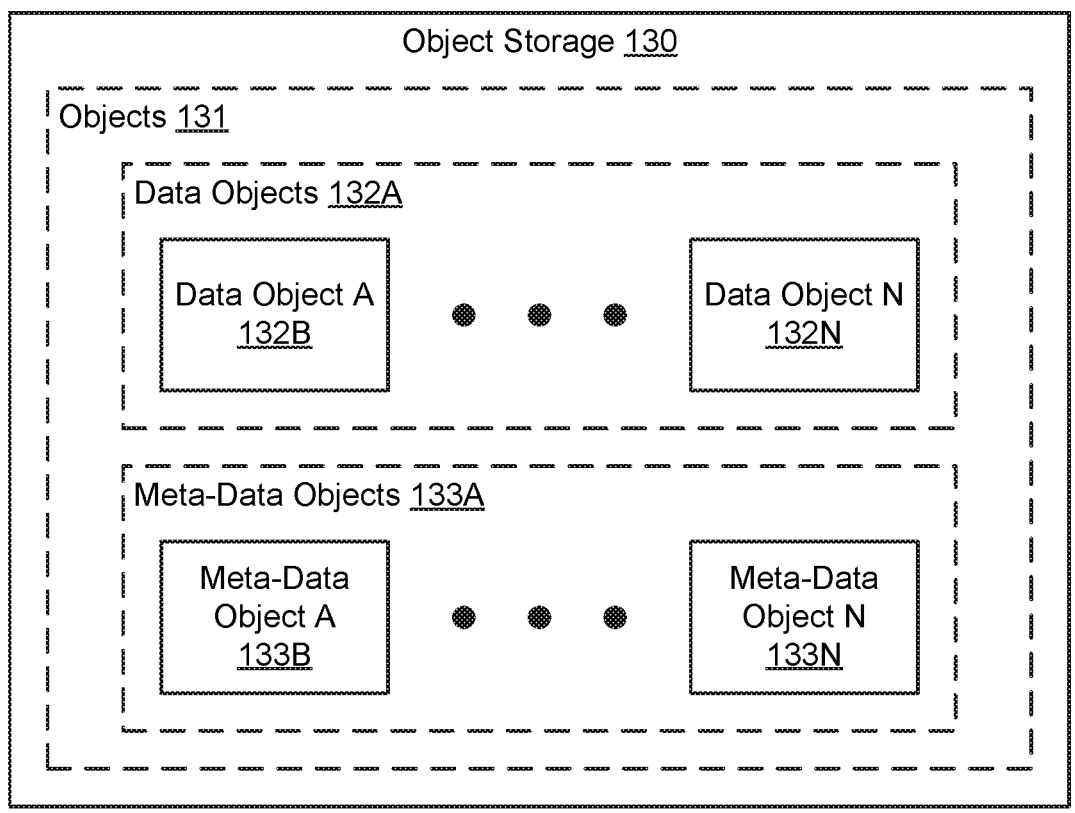
FIG. 1B shows a diagram of an object storage in accordance with one or more embodiments of the invention.

As discussed above, the object generator (150) may generate objects stored in the object storage (130). FIG. 1B shows a diagram of an object storage (130) in accordance with one or more embodiments of the invention. The object storage (130) may be a data structure that organizes stored data into objects.

In one or more embodiments of the invention, the object storage (130) may include data objects (132A) and meta-data objects (133A). The data objects (132A) may include file segments of files. The meta-data objects (133A) may include meta-data regarding the file segments stored in data objects (132A).

Figure 2A:
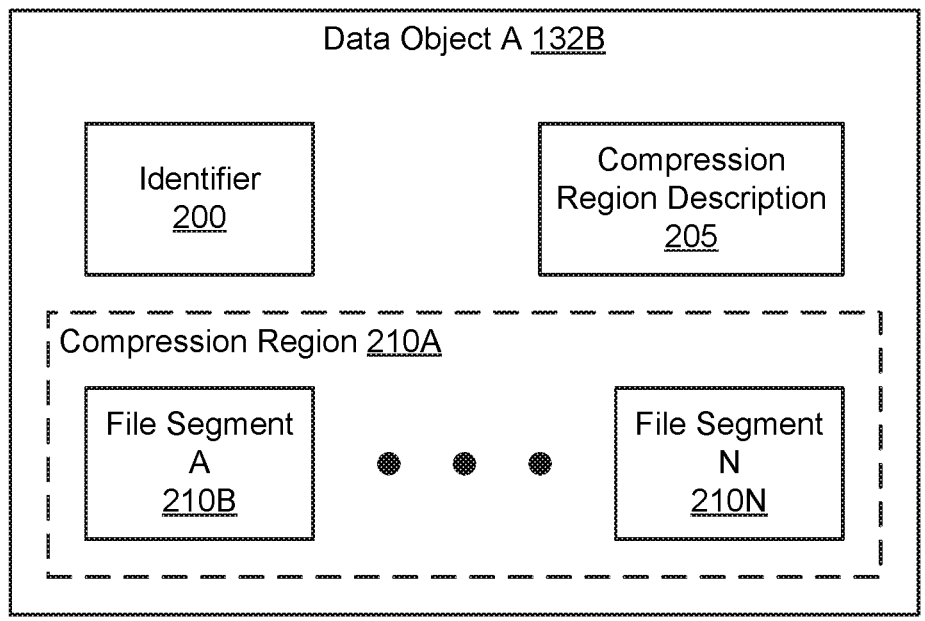
FIG. 2A shows a diagram of a data object in accordance with one or more embodiments of the invention.

FIG. 2A shows an example of a data object in accordance with one or more embodiments of the invention. The data object A (132B) may include an identifier (200), a compression region description (205), and a compression region (210A).

The identifier (200) may be a name, bit sequence, or other information used to identify the data object. The identifier (200) may uniquely identify the data from the other objects of the object storage.

The compression region description (205) may include description information regarding the compression region (210A). The compression region description (205) may include information that enables file segments stored in the compression region (210A) to be read. The compression region description (205) may include, for example, information that specifies the start of each file segment, the length of each file segment, and/or the end of each file segment stored in the compression region. The compression region description (205) may include other information without departing from the invention.

The compression region (210A) may include any number of file segments (210B-210N). The file segments of the compression region (210A) may be aggregated together. The compression region (210A) may be compressed. The compression of the compression region (210A) may be a lossless compression.

Figure 2B:
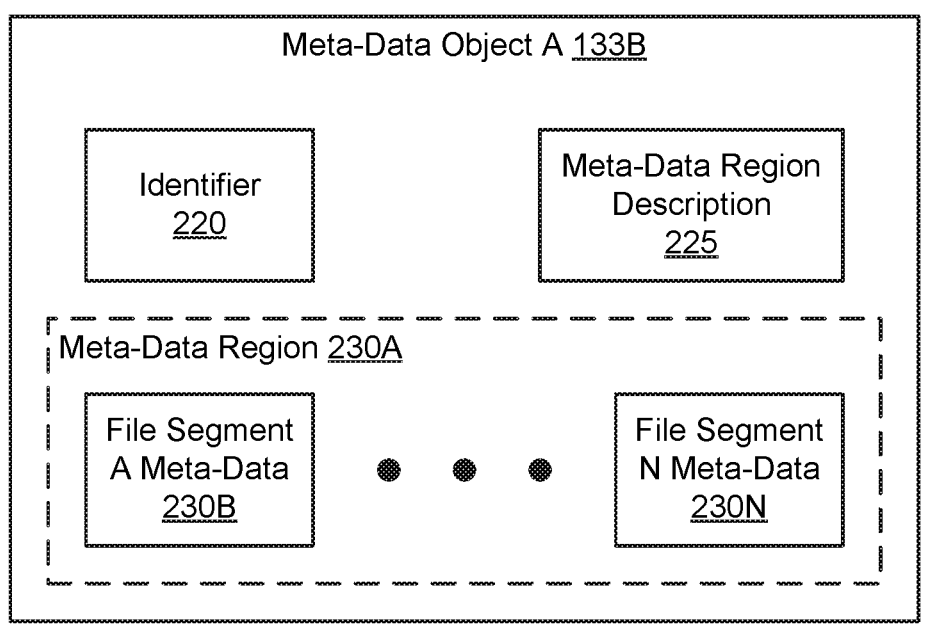
FIG. 2B shows a diagram of a meta-data object in accordance with one or more embodiments of the invention.

FIG. 2B shows an example of a meta-data object in accordance with one or more embodiments of the invention. The meta-data object A (133B) may include an identifier (220), a meta-data region description (225), and a meta-data region (230A).

The identifier (220) may be a name, bit sequence, or other information used to identify the data object. The identifier (220) may uniquely identify the data from the other objects of the object storage.

The meta-data region description (225) may include description information regarding the meta-data region (230A). The meta-data region description (225) may include information that enables file segment meta-data stored in the meta-data region (230A) to be read. The meta-data region description (225) may include, for example, information that specifies the start of each file segment meta-data, the length of each file segment meta-data, and/or the end of each file segment meta-data stored in the meta-data region (230A). The meta-data region description (225) may include other information without departing from the invention.

The meta-data region (230A) may include file segment meta-data (230B-230N) regarding file segments stored in one or more data objects of the object storage. The file segment meta-data stored in the meta-data region (230A) may be aggregated together. In one or more embodiments of the invention, the meta-data region (230A) is not compressed.

Figure 2C:
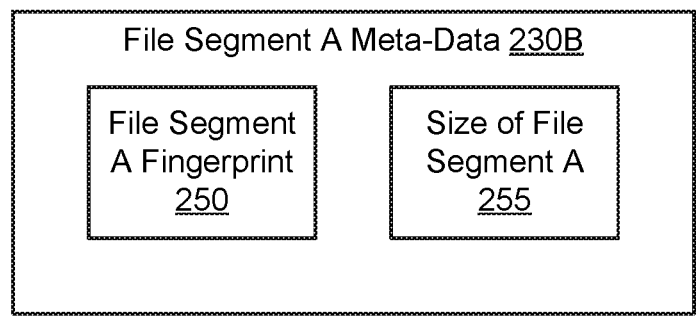
FIG. 2C shows a diagram of meta-data stored in a meta-data object in accordance with one or more embodiments of the invention.

FIG. 2C shows an example of file segment meta-data in accordance with one or more embodiments of the invention. The file segment A meta-data (230B) includes meta-data regarding an associated file segment stored in a data object of the object storage. The file segment A meta-data (230B) includes a file segment A fingerprint (250) and a size of file segment A (255). The file segment A meta-data (230B) may include a fingerprint of the associated file segment. The size of file segment A (255) may specify the size of the associated file segment.

As used herein, a fingerprint of a file segment may be a bit sequence that virtually uniquely identifies the file segment from other file segments stored in the object storage. As used herein, virtually uniquely means that the probability of collision between each fingerprint of two file segments that include different data is negligible, compared to the probability of other unavoidable causes of fatal errors. In one or more embodiments of the invention, the probability is $10^{-20}$ or less. In one or more embodiments of the invention, the unavoidable fatal error may be caused by a force of nature such as, for example, a tornado. In other words, the fingerprint of any two file segments that specify different data will virtually always be different.

Fingerprints of the file segments stored in the object storage may be used to deduplicate files for storage in the object storage. To further clarify the relationships between files, file segments, and fingerprints, FIGS. 2D, 3A, and 3B include graphical representations of the relationships.

Figure 2D:
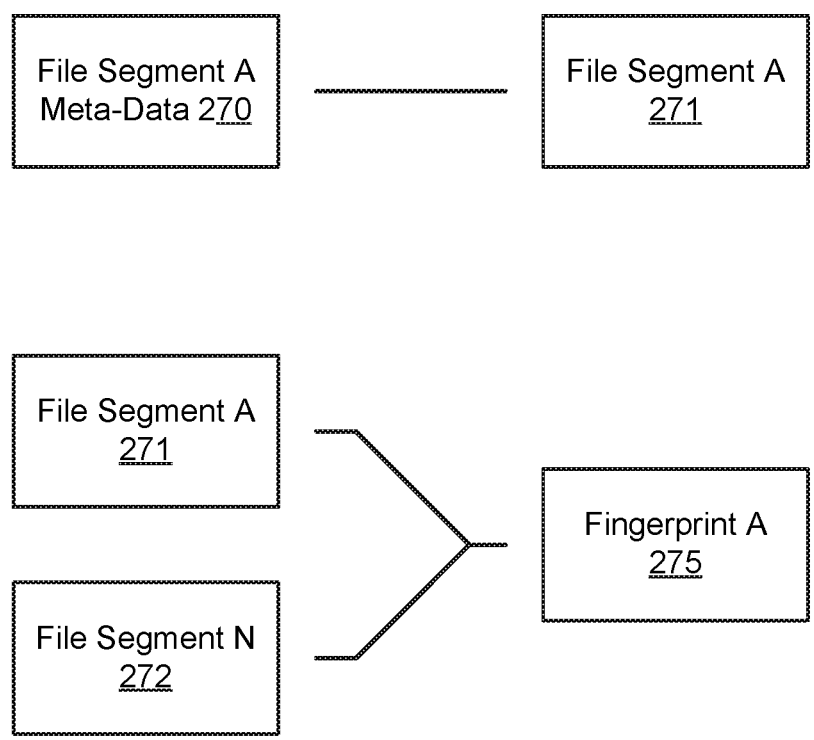
FIG. 2D shows a diagram of data relationships in accordance with one or more embodiments of the invention.

More specifically, FIG. 2D shows a relationship diagram that illustrate relationships between file segments, meta-data of the file segments, and fingerprints of the meta-data in accordance with one or more embodiments of the invention.

As seen from the diagram, there is a one to one relationship between meta-data regarding a file segment stored in the object storage and the file segment stored in the object storage. In other words, for an example file segment A (271) stored in a data object of the object storage, associated file segment A meta-data (270) will be store in a meta-data object storage. A single copy of the file segment A (271) and the file segment A meta-data (270) will be stored in the object storage.

Additionally, as seen from FIG. 2D, there is a one to many relationship between file segments and fingerprints. More specifically, file segments of different files, or the same file, may have the same fingerprint. For example, a file segment A (271) of a first file and a file segment B (272) of a second file may have the same fingerprint A (275) if both include the same data.

Figure 3A:
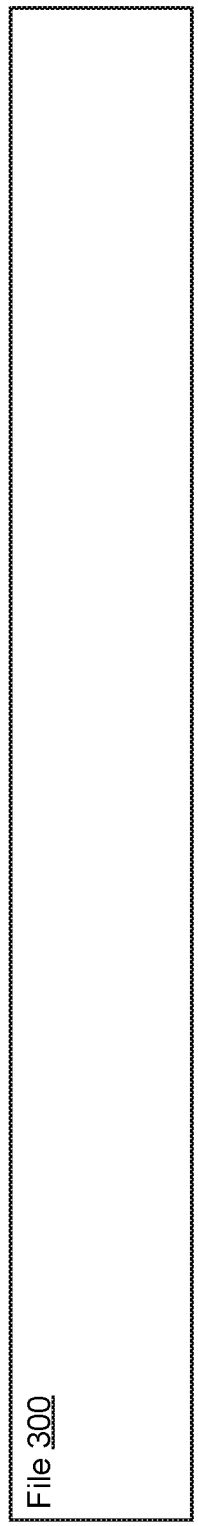
FIG. 3A shows a diagram of a file in accordance with one or more embodiments of the invention.

FIG. 3A shows a diagram of a file (300) in accordance with one or more embodiments of the invention. The file may include data. The data may be any type of data, may be in any format, and of any length.

Figure 3B:
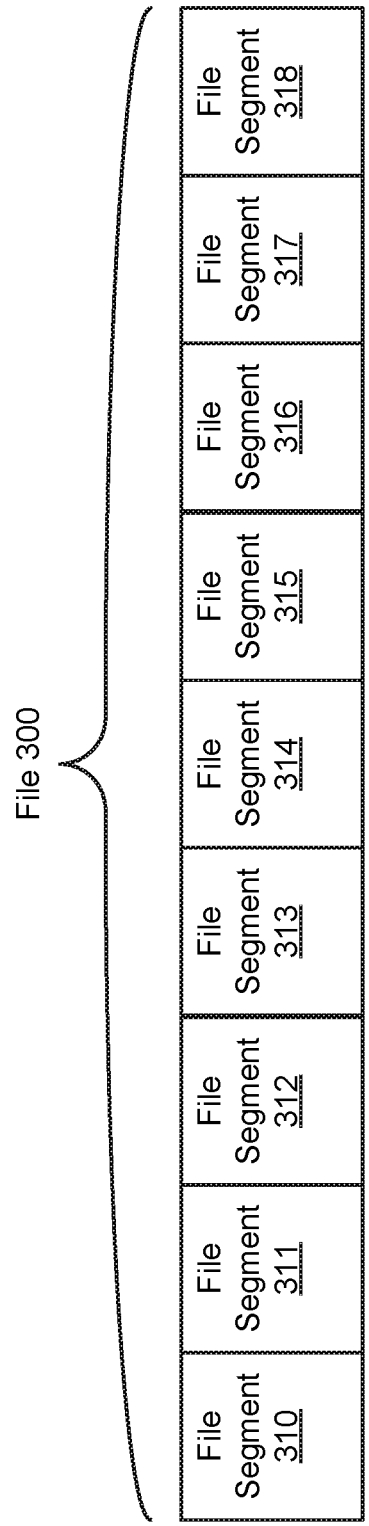
FIG. 3B shows a diagram of a relationship between file segments of a file and the file in accordance with one or more embodiments of the invention.

FIG. 3B shows a diagram of file segments (310-318) of the file (300) of the data. Each file segment may include separate, distinct portions of the file (300). Each of the file segments may be of different, but similar lengths. For example, each file segment may include approximately 8 kilobytes of data, e.g., a first file segment may include 8.03 kilobytes of data, the second file segment may include 7.96 kilobytes of data, etc. In one or more embodiments of the invention, the average amount of data of each file segment is between 7.95 and 8.05 kilobytes. A file may be broken up into file segment using the method illustrated in FIG. 4B.

As discussed above, the data management device (110, FIG. 1A) may receive data from clients (100, FIG. 1A) for storage. The data management device (110, FIG. 1A) may store the data in an object storage (130, FIG. 1A). FIGS. 4A-4E show flowcharts of methods of storing data in the object storage (130, FIG. 1D).

Figure 4A:
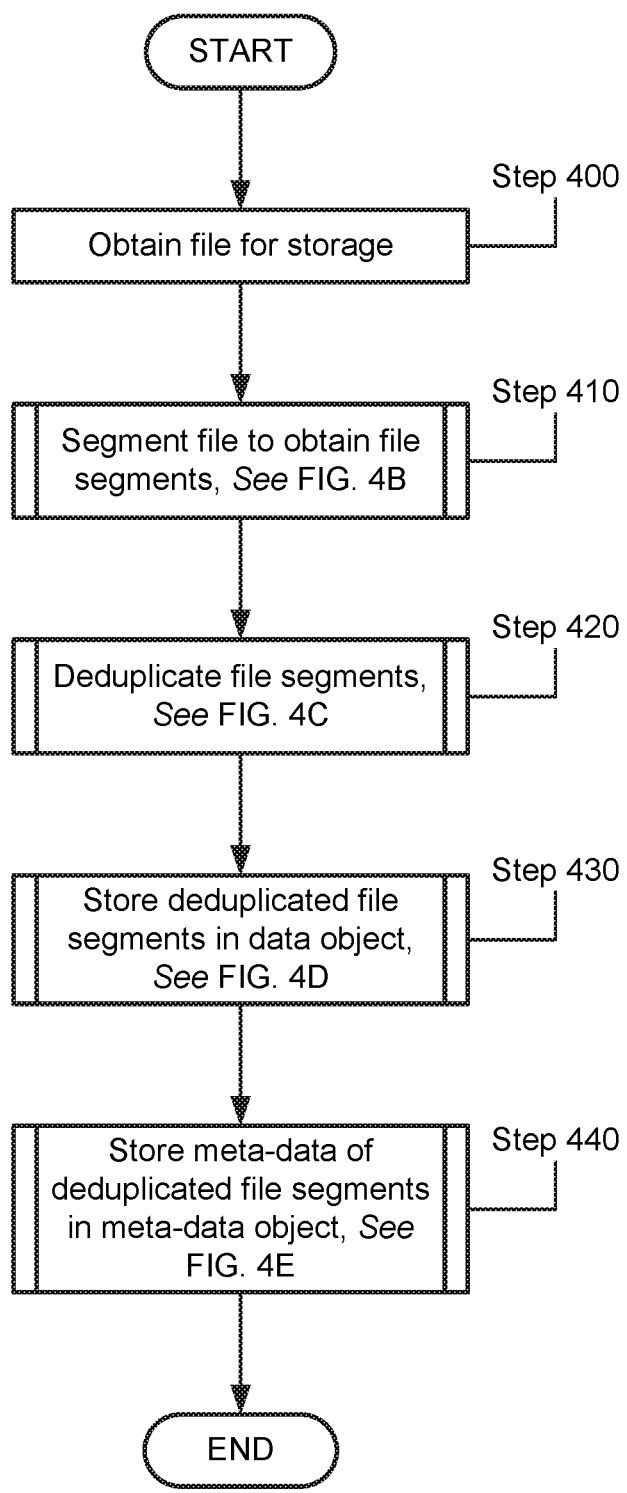
FIG. 4A shows a flowchart of a method of storing data in an object storage in accordance with one or more embodiments of the invention.

FIG. 4A shows a flowchart of a method in accordance with one or more embodiments of the invention. The method depicted in FIG. 4A may be used to store data in an object storage in accordance with one or more embodiments of the invention. The method shown in FIG. 4A may be performed by, for example, an object generator (150, FIG. 1A). Other component of the data management device (110) or the illustrated system may perform the method illustrated in FIG. 4A without departing from the invention.

In Step 400, a file is obtained for storage. The file may be obtained by receiving a file storage request from a client that specifies the file.

In Step 410, the file is segmented to obtain file segments. The file may be segmented to obtain file segments by performing the method shown in FIG. 4B. The file may be segmented to obtain file segments using other methods than the method shown in FIG. 4B without departing from the invention.

In Step 420, the file segments are deduplicated. The file segments may be deduplicated using the method shown in FIG. 4C. The file segments may be deduplicated using other methods than the method shown in FIG. 4C without departing from the invention.

In Step 430, the deduplicated file segments are stored in a data object. The file segments may be stored in a data object using the method shown in FIG. 4D. The file segments may be stored in a data object using other methods than the method shown in FIG. 4D without departing from the invention.

In Step 440, meta-data of the deduplicated file segments are stored in a meta-data object. The meta-data of the deduplicated file segments may be stored in a meta-data object using the method shown in FIG. 4E. The meta-data of the deduplicated file segments may be stored in a meta-data object using other methods than the method shown in FIG. 4C without departing from the invention.

The method may end following Step 440.

Figure 4B:
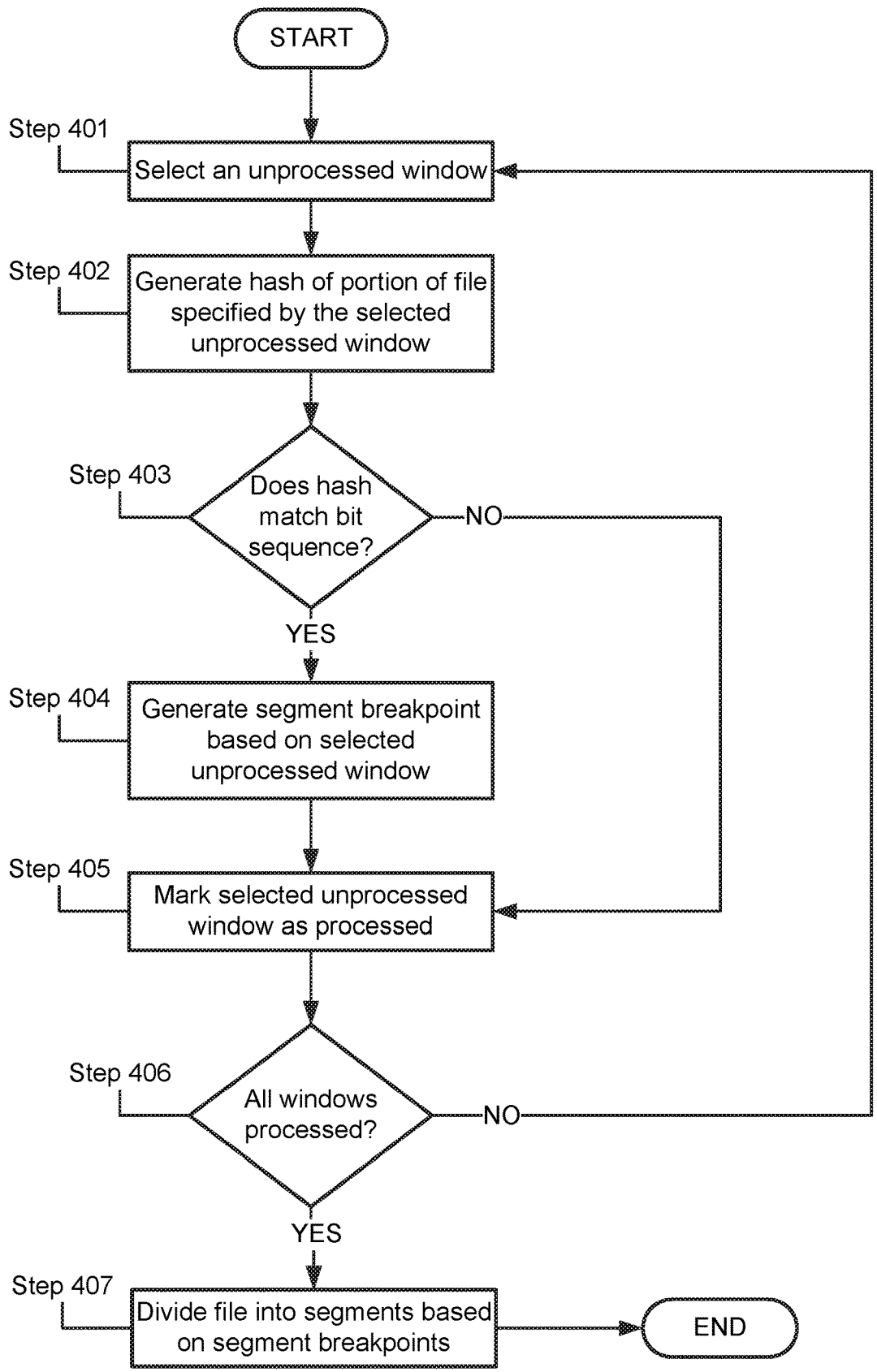
FIG. 4B shows a flowchart of a method of segmenting a file in accordance with one or more embodiments of the invention.

FIG. 4B shows a flowchart of a method in accordance with one or more embodiments of the invention. The method depicted in FIG. 4B may be used to store file segments of a file in accordance with one or more embodiments of the invention. The method shown in FIG. 4A may be performed by, for example, an object generator (150, FIG. 1A). Other component of the data management device (110) or the illustrated system may perform the method illustrated in FIG. 4B without departing from the invention.

In Step 401, an unprocessed window of a file is selected. As used herein, a window of a portion of the file is a predetermined number of bits of the file. For example, a first window may be the first 1024 bits of the file, a second window may be 1024 bits of the file starting at the second bit of the file, the third window may be 1024 bits of the file starting at the third bit, etc. Each window of the file may be considered to be unprocessed at the start of the method illustrated in FIG. 4B.

In Step 402, a hash of the portion of the file specified by the unprocessed window is obtained. In one or more embodiments of the invention, the hash may be a cryptographic hash. In one or more embodiments of the invention, the cryptographic hash is a secure hash algorithm 1 (SHA-1) hash. In one or more embodiments of the invention, the cryptographic hash is a secure hash algorithm 2 (SHA-2) or a secure hash algorithm 3 (SHA-3) hash. Other hashes may be used without departing from the invention.

In Step 403, hash is compared to a predetermined bit sequence. If the hash matches the predetermined bit sequence, the method proceeds to Step 404. If the hash does not match the predetermined bit sequence, the method proceeds to Step 405.

In one or more embodiments of the invention, the predetermined bit sequence includes the same number of bits as the hash. The predetermined bit sequence may be any bit pattern. The same bit pattern may used each time a hash is compared to the bit sequence in the method shown in FIG. 4B.

In Step 404, a segment breakpoint may be generated based on the selected unprocessed window. The segment breakpoint may specify a bit of the file. The bit of the file may be the first bit of the file specified by the unprocessed window.

In Step 405, the selected unprocessed window is marked as processed. The selected unprocessed window may be marked as unprocessed by, for example, incrementing a bookmark that specifies a bit of the file to the next bit of the file.

In Step 406, it is determined whether all of the windows of the file are processed. If all of the windows of the file are processed, the method may proceed to Step 407. If all of the windows of the file are not processed, the method may proceed to Step 401.

In one or more embodiments of the invention, the length of the window and the bookmark that specifies the bit of the file may be used to determine whether all of the windows are processed. Specifically, the bookmark and the length of the window may be used to determine whether the window would exceed the length of the file.

In Step 407, the file is divided into file segments using the segment breakpoints. As discussed above, the segment breakpoints may specify bits of the file. The file may be broken into file segments starting and ending at each of the breakpoints.

The method may end following Step 407.

In one or more embodiments of the invention, the method shown in FIG. 4B may be described as performing a rolling hash of the file. Performing the rolling hash may generate hashes, i.e., bit sequences, corresponding to portions of the file. Each portion of the file may start at different bits of the file and include the same number of bits. Each of the generated hashes may be compared to a predetermined bit sequence and thereby generate segment breakpoints. Each time a file is segmented using the method shown in FIG. 4B, the same predetermined bit sequence may be used in Step 403. Using the same bit sequence in Step 403 will increase the likelihood that file are segmented similarly each time copies of the file are segmented.

Figure 4C:
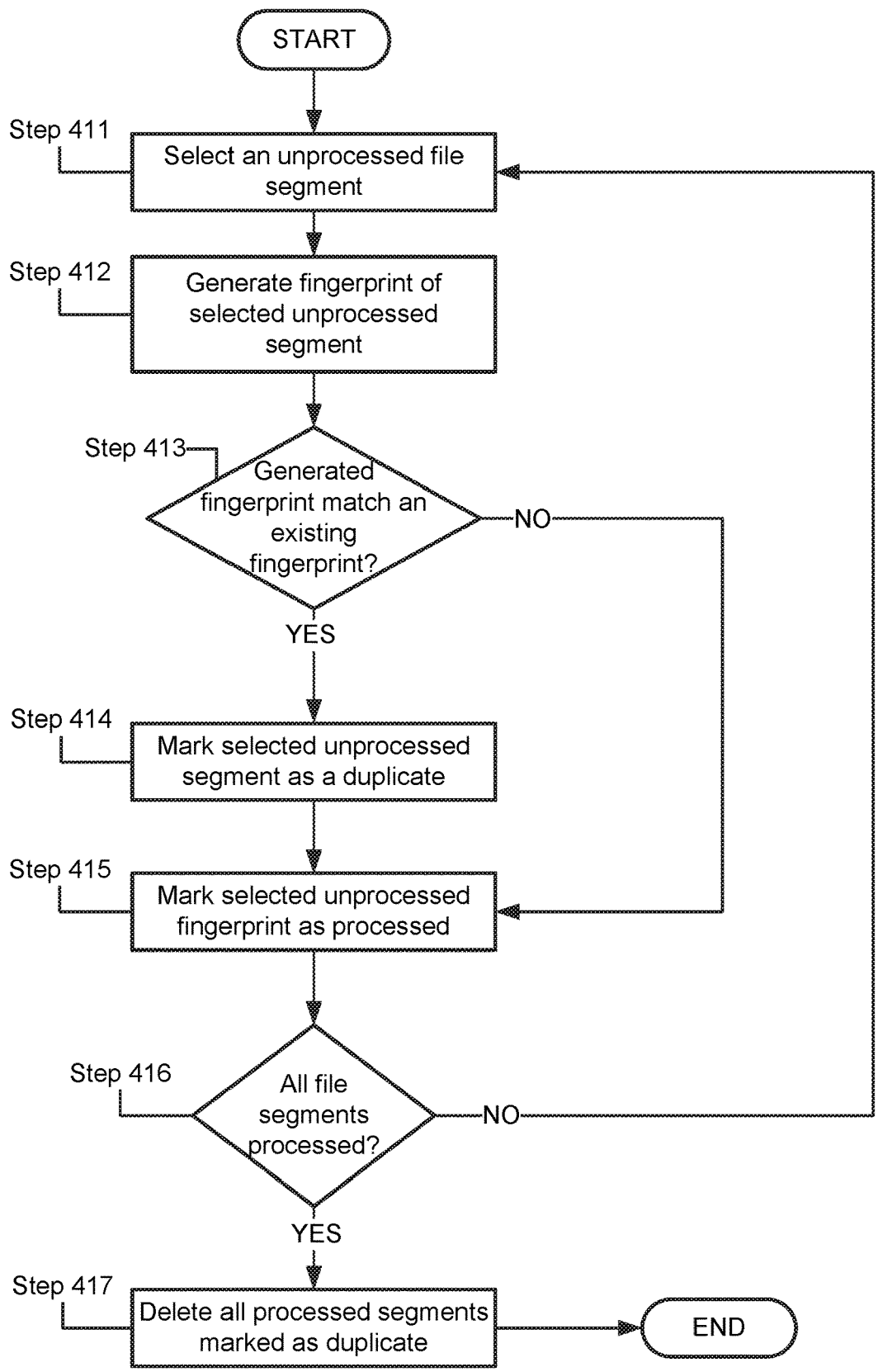
FIG. 4C shows a flowchart of a method of deduplicating file segments in accordance with one or more embodiments of the invention.

FIG. 4C shows a flowchart of a method in accordance with one or more embodiments of the invention. The method depicted in FIG. 4C may be used to deduplicate file segments of a file in accordance with one or more embodiments of the invention. The method shown in FIG. 4C may be performed by, for example, an object generator (150, FIG. 1A). Other component of the data management device (110) or the illustrated system may perform the method illustrated in FIG. 4C without departing from the invention.

In Step 411, an unprocessed file segment of a file is selected. At the start of the method illustrated in FIG. 4C, all of the file segments of a file may be considered to be unprocessed.

In Step 412, a fingerprint of the selected unprocessed file segment is generated. In one or more embodiments of the invention, the fingerprint of the unprocessed file segment is generated using Rabin's fingerprinting algorithm. In one or more embodiments of the invention, the fingerprint of the unprocessed file segment is generated using a cryptographic hash function. The cryptographic hash function may be, for example, a message digest (MD) algorithm or a secure hash algorithm (SHA). The message MD algorithm may be MD5. The SHA may be SHA-0, SHA-1, SHA-2, or SHA3. Other fingerprinting algorithms may be used without departing from the invention.

In Step it is determined whether the generated fingerprint matches an existing fingerprint stored in the object storage. If the generated fingerprint matches an existing fingerprint, the method proceeds to Step 414. If the generated fingerprint does not match an existing fingerprint, the method proceeds to Step 405.

In one or more embodiments of the invention, the generated fingerprint is only a matched to a portion of the fingerprints stored in the object storage. For example, only fingerprints stored in a portion of the meta-data objects of the object storage may be loaded into memory and used as the basis for comparison of the generated fingerprint.

In Step 414, the selected unprocessed file segment is marked as a duplicate.

In Step 415, the selected unprocessed file segment is marked as processed.

In Step 416, it is determined whether all of the file segments of the file are processed. If all of the windows of the file segments of the file are processed, the method may proceed to Step 417. If all of the windows of the file segments of the file are not processed, the method may proceed to Step 411.

In Step 417, all of the file segments marked as duplicate are deleted. The remaining file segments, i.e., the file segments not deleted in Step 417, are the deduplicated file segments.

The method may end following Step 417.

While FIG. 4C shows a process of performing deduplication by identifying groups of duplicate segments and then deleting the segments, other methods that are not performed in a batch process can be used without departing from the invention. For example, whenever a fingerprint is identified to not match an existing fingerprint in Step 413, the corresponding file segment could be stored in a data object. In other words, an inline rather than a batching processes could be used without departing from the invention.

Figure 4D:
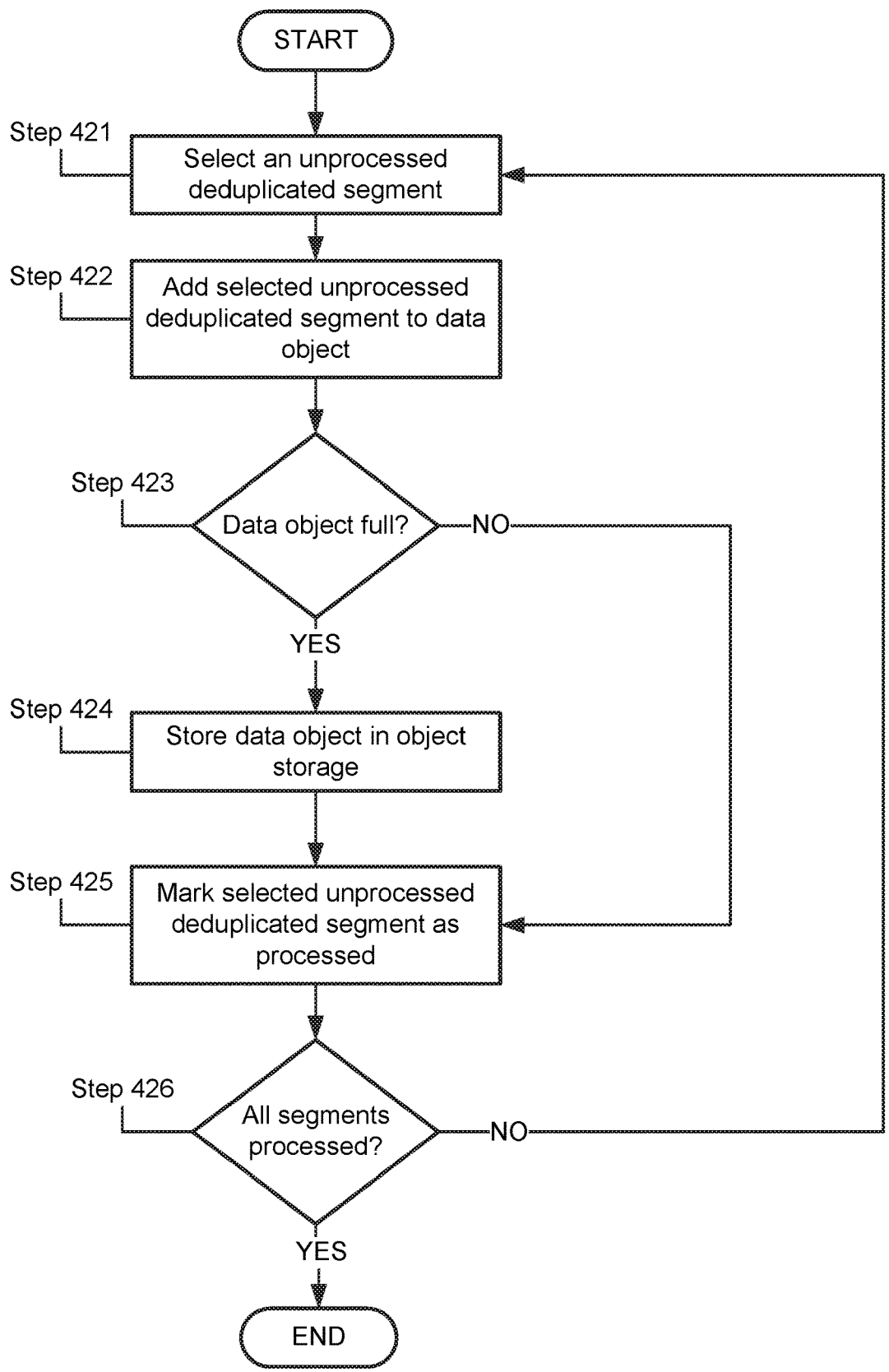
FIG. 4D shows a flowchart of a method of storing deduplicated file segments in a data object in accordance with one or more embodiments of the invention.

FIG. 4D shows a flowchart of a method in accordance with one or more embodiments of the invention. The method depicted in FIG. 4D may be used to store deduplicate file segments in an object storage in accordance with one or more embodiments of the invention. The method shown in FIG. 4D may be performed by, for example, an object generator (150, FIG. 1A). Other component of the data management device (110) or the illustrated system may perform the method illustrated in FIG. 4D without departing from the invention.

In Step 421, an unprocessed deduplicated file segment is selected. At the start of the method illustrated in FIG. 4D, all of the file segments may be considered to be unprocessed.

In Step 422, the selected unprocessed deduplicated file segment is added to a data object.

In one or more embodiments of the invention, the selected unprocessed deduplicated file segment may be added to a compression region of a data object. The unprocessed deduplicated file segment may be compressed before being added to the compression region. The compression region description of the data object may be updated based on the addition. More specifically, the start, length, and/or end of the deduplicated file segment within the data object may be added to the compression region description. Different information may be added to the compression region description to update the compression region description without departing from the invention.

In Step 423, it is determined whether the data object is full. If the data object is full, the method proceeds to Step 424. If the data object is not full, the method proceeds to Step 425.

The data object may be determined to be full based on the quantity of data stored in the compression region. More specifically, the determination may be based on a number of bytes required to store the compressed file segments of the compression region. The number of bits may be a predetermined quantity of bits such as, for example, 5 megabytes.

In Step 424, the data object is stored in the object storage.

In one or more embodiments of the invention, the file segments of the compression region may be compressed before the data object is stored in the object storage.

In Step 425, the selected unprocessed deduplicated file segment is marked as processed.

In Step 426, it is determined whether all of the deduplicated file segments are processed. If all of the deduplicate file segments are processed, the method may end following Step 426. If all of the deduplicated file segments are not processed, the method may proceed to Step 421.

Figure 4E:
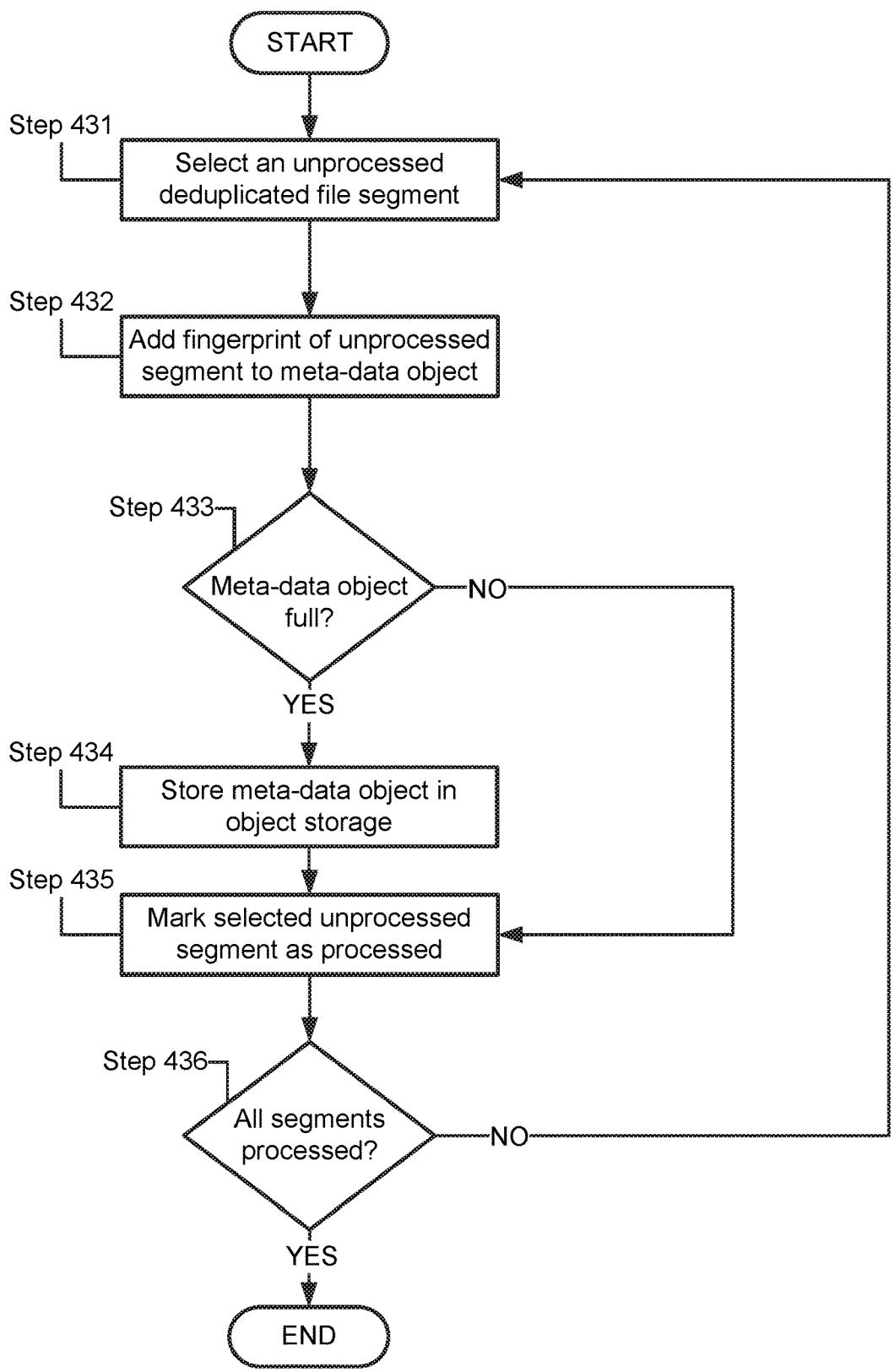
FIG. 4E shows a flowchart of a method of storing meta-data of deduplicated file segments in a meta-data object in accordance with one or more embodiments of the invention.

FIG. 4E shows a flowchart of a method in accordance with one or more embodiments of the invention. The method depicted in FIG. 4E may be used to store meta-data in an object storage in accordance with one or more embodiments of the invention. The method shown in FIG. 4E may be performed by, for example, an object generator (150, FIG. 1A). Other component of the data management device (110) or the illustrated system may perform the method illustrated in FIG. 4E without departing from the invention.

In Step 431, an unprocessed deduplicated file segment is selected. At the start of the method illustrated in FIG. 4E, all of the deduplicated file segments may be considered to be unprocessed.

In Step 432, a fingerprint of the selected unprocessed deduplicate file segment is added to a meta-data object.

In one or more embodiments of the invention, the fingerprint of the selected unprocessed deduplicated file segment may be added to a meta-data region of a meta-data object. The meta-data region description of the meta-data object may be updated based on the addition. More specifically, the start, length, and/or end of the fingerprint within the data object may be added to the meta-data region description. Different information may be added to the meta-data region description to update the meta-data region description without departing from the invention. For example, a size of the selected unprocessed deduplicated file segment may be added to the meta-data region, in addition to the fingerprint, without departing from the invention.

In Step 433, it is determined whether the meta-data object is full. If the meta-data object is full, the method proceeds to Step 434. If the meta-data object is not full, the method proceeds to Step 435.

The meta-data object may be determined to be full based on the quantity of data stored in the meta-data region. More specifically, the determination may be based on a number of bytes required to store the meta-data of the meta-data region. The number of bits may be a predetermined quantity of bits such as, for example, 5 megabytes.

In Step 434, the meta-data object is stored in the object storage.

In Step 435, the selected unprocessed deduplicated file segment is marked as processed.

In Step 436, it is determined whether all of the deduplicated file segments are processed. If all of the deduplicate file segments are processed, the method may end following Step 436. If all of the deduplicated file segments are not processed, the method may proceed to Step 431.

While illustrated as separate methods in FIGS. 4D and 4E, embodiments of the invention are not limited to separately performed methods. For example, both of the methods may be performed at the same time. Steps 432-435 may be performed in coordination with Step 422-425 of FIG. 4D.

The following is an explanatory example. The explanatory example is included for purposes of explanation and is not limiting.

EXAMPLE

Figure 5A:
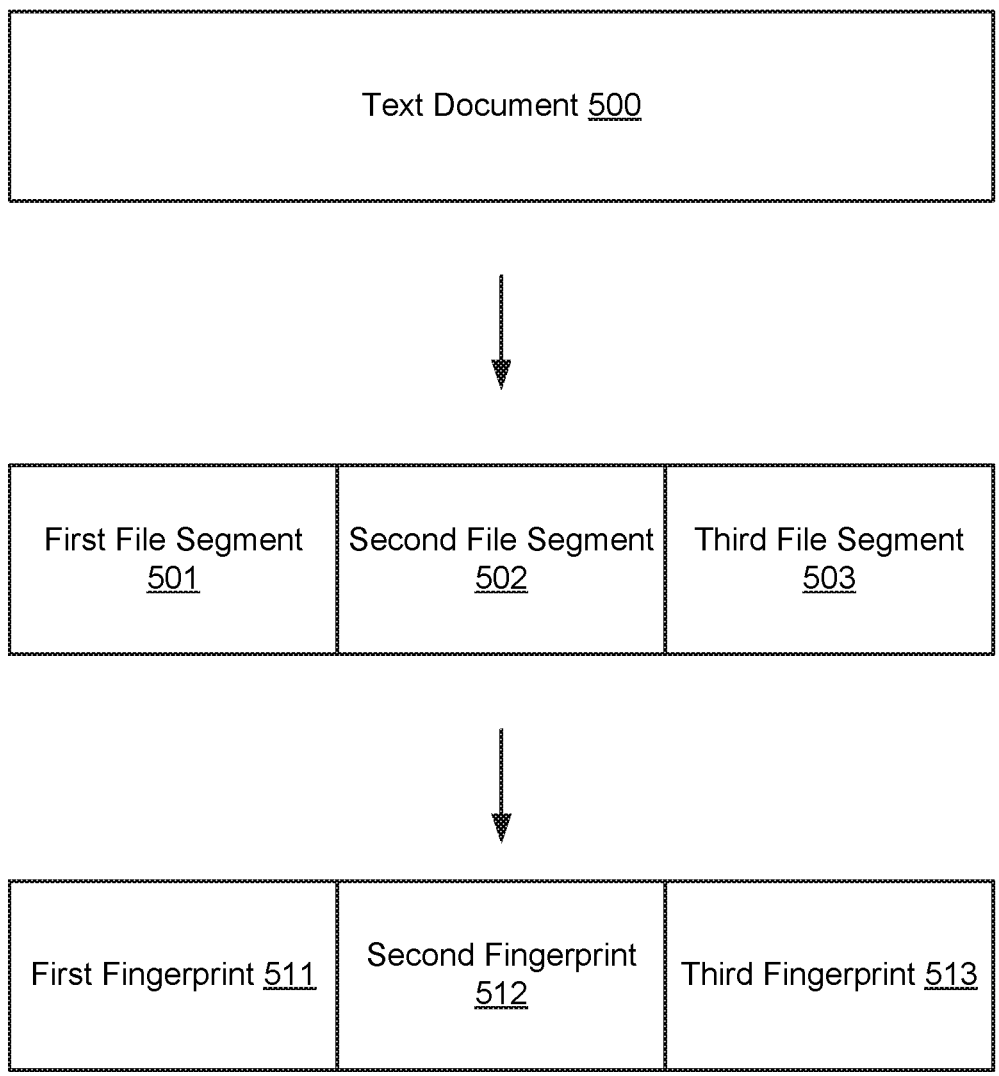
FIG. 5A shows a first portion of an example of storing data in an object storage.

A client send a data storage request to a data management device. The data storage request specifies a text document 500 as shown in FIG. 5A.

In response to the data storage request, the data management device obtains the requested text document 500. The text document may be, for example, a word document including a final draft of a report documenting the status of a project. A previous draft of the report documenting the status of the project is already stored in the data management device.

The data management device segments the file a first file segment (501), a second file segment (502), and a third file segment (503). The data management device generates a first fingerprint (511) of the first file segment (501), a second fingerprint (512) of the second file segment (502), and a third fingerprint (513) of the third file segment (503). The first file segment includes an introductory portion of the report that was not changed from the draft of the report. The second file segment includes a required materials portion of the report that was changed from the draft of the report. The third file segment includes a project completion timeline that was changed from draft of the report.

Figure 5B:
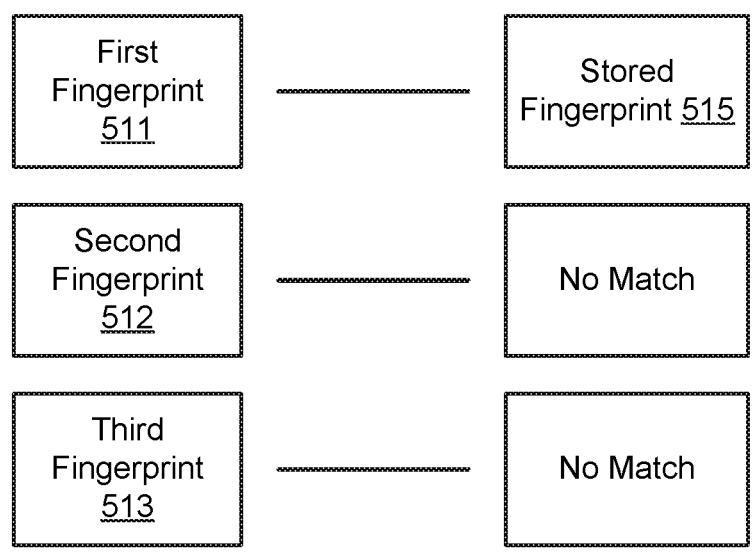
FIG. 5B shows a second portion of the example of storing data in the object storage.

The file segments (511-513) are then deduplicated. During deduplication shown in FIG. 5B, the data management device matched the first fingerprint (511) to a stored fingerprint (515) corresponding to a file segment of the draft report that included the introduction section of the report. The second fingerprint (512) and third fingerprint (513) did not match any fingerprints in the object storage.

Figure 5C:
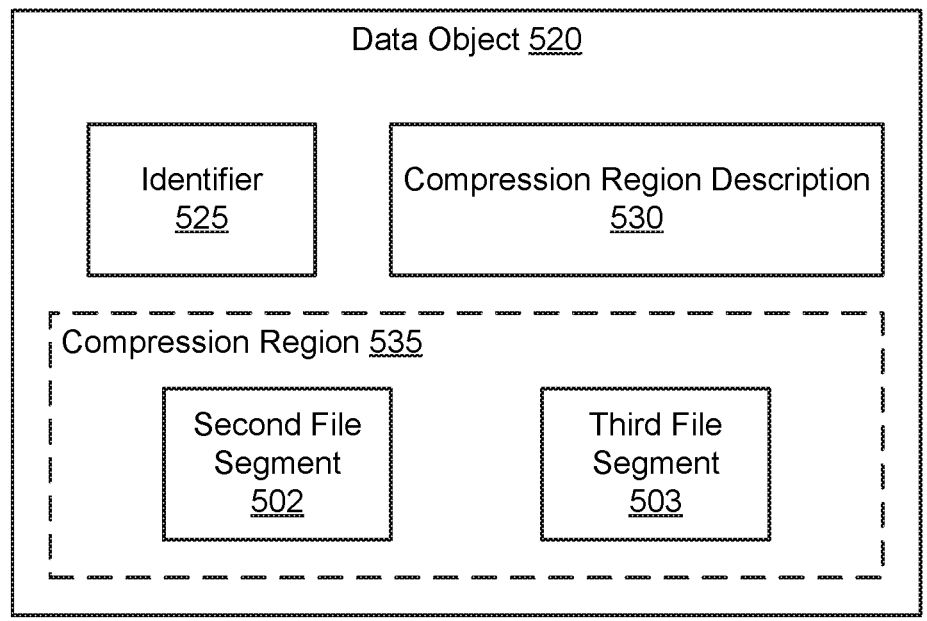
FIG. 5C shows a third portion of the example of storing data in the object storage.
Figure 5C:
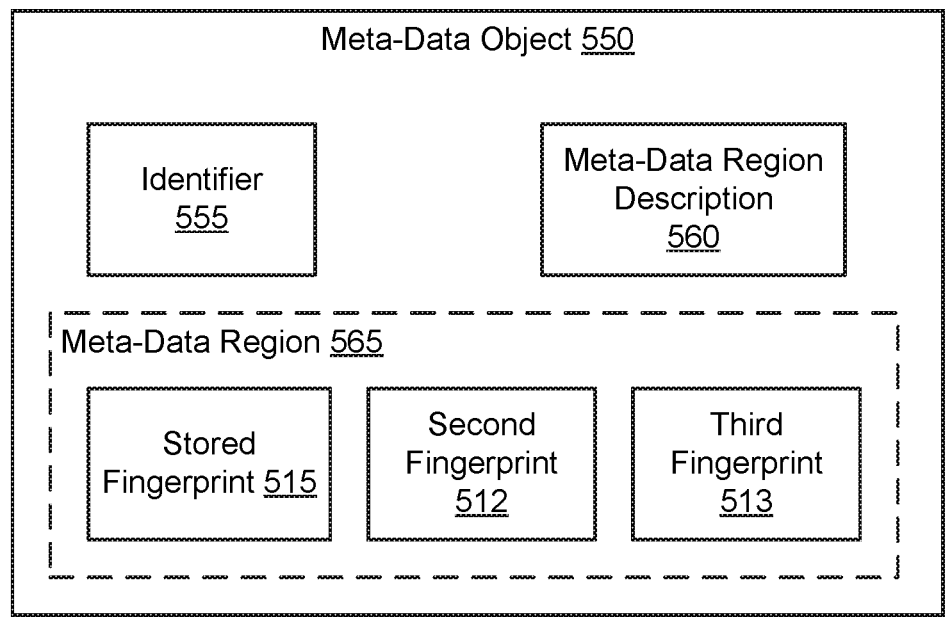

Based on the match, only the second file segment (502) and third file segment (503) were added to a data object (520) for storage in the object storage as shown in FIG. 5C. The first file segment (501) was deleted. Similarly, only the second fingerprint (512) and third fingerprint (513) were added to a meta-data object (550) of the object storage.

The example ends following the storage of the data object (520) and meta-data object (550) in the object storage.

One or more embodiments of the invention may be implemented using instructions executed by one or more processors in the data storage device. Further, such instructions may correspond to computer readable instructions that are stored on one or more non-transitory computer readable mediums.

One or more embodiments of the invention may enable one or more of the following: i) reduces the number of disk input-output (IO) operation required to deduplicate a file when compared to an object storage that stores both data and meta-data in the same object, ii) reduces the number of disk (IO) operation required to required to perform garbage collection when compared to an object storage that stores both data and meta-data in the same object, and iii) reduces the bandwidth used to perform deduplication when a portion of the object storage utilizes data store of a remote computing device.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A data management device, comprising:
a persistent storage comprising:
an object storage that:
stores data objects,
wherein a data object of the data objects stores aggregations of deduplicated and compressed file segments of files in a first region that is compressed,
wherein the data object comprises a compression region descriptor that specifies the contents of the first region and that is stored in a non-compressed second region that is distinct from the first region,
wherein the first region and the second region are both stored within a structure making up an entirety of the data object, and
wherein the entirety of the data object including the first region and the second region is stored in a same one of the persistent storage, and
stores meta-data objects in an uncompressed format,
wherein the meta-data objects each store aggregations of meta-data of the file segments of the files; and
a namespace that is stored together with the object storage on the persistent storage that associates the files with a file recipe that is also stored in the persistent storage, wherein the file recipe is used to generate the files using the file segments stored in the first region of the data object, wherein the file recipe comprises information that enables the file segments stored in the first region of the data object to be retrieved from the data object, and wherein the persistent storage comprises the namespace instead of a file system; and
a processor programmed to:
segment a file of the files into a plurality of file segments;
generate meta-data of the plurality of file segments;
store a portion of the plurality of file segments in the first region of the data object of the data objects; and
store a portion of the meta-data of the plurality of file segments in a meta-data object of the meta-data objects.

2. The data management device of claim 1, wherein the meta-data object comprises:
the meta-data of the plurality of file segments; and
meta-data of file segments associated with a second file.

3. The data management device of claim 2, wherein the meta-data of the plurality of file segments comprises:
a fingerprint of a file segment of the plurality of file segments; and
a size of the file segment of the plurality of file segments.

4. The data management device of claim 2, wherein the meta-data object comprises:
a meta-data region descriptor that specifies the contents of a meta-data region comprising
the meta-data of the plurality of file segments and the meta-data of the file segments associated with the second file.

5. The data management device of claim 4, wherein the meta-data region is not compressed.

6. The data management device of claim 1, wherein segmenting the file into a plurality of file segments comprises:
generating a rolling hash of the file;
selecting a plurality of segment breakpoints based on the rolling hash; and
dividing the file into the plurality of file segments based on the segment breakpoints.

7. The data management device of claim 1, wherein generating meta-data of the plurality of file segments comprises:
- generating a fingerprint of a first file segment of the plurality of file segments;
- matching the fingerprint to a second plurality of fingerprints stored in the object storage;
- making a determination that the fingerprint matches a fingerprint of the second plurality of fingerprints; and
- deleting the first file segment based on the determination.

8. The data management device of claim 7, wherein the second plurality of fingerprints is stored in data objects of the object storage that do not include file segments of any file stored in the object storage.

9. The data management device of claim 1, wherein generating meta-data of the plurality of file segments comprises:
- generating a fingerprint of a first file segment of the plurality of file segments;
- matching the fingerprint to a second plurality of fingerprints stored in the object storage;
- making a determination that the fingerprint does not match a fingerprint of the second plurality of fingerprints; and
- selecting the first file segment for storage in the data object.

10. The data management device of claim 1, wherein storing the portion of the plurality of file segments in the data object of the object storage comprises:
- adding a first file segment of the plurality of file segments to a first data object;
- making a determination that the first data object is full based on the addition of the first file segment;
- in response to the determination, storing the first data object in the object storage; and
- adding a second file segment of the plurality of file segments to a second data object that is not full.

11. The data management device of claim 1, wherein store the portion of the meta-data of the plurality of file segments in the meta-data object of the object storage comprises:
- adding a fingerprint of a first file segment of the plurality of file segments to the meta-data object;
- making a determination that the first meta-data object is not full based on the addition of the fingerprint of the first file segment; and
- in response to the determination, adding a fingerprint of a second file segment of the plurality of file segments to the meta-data object.

12. A method of operating a data management device, comprising:
- segmenting, by the data management device, a file into a plurality of file segments;
- generating, by the data management device, meta-data of the plurality of file segments;
- storing, by the data management device, a portion of the plurality of file segments in a data object of an object storage, wherein the object storage is stored in a persistent storage of the data management device,
  - wherein the plurality of file segments is stored in a deduplicated and compressed format in a first region of the data object that is compressed,
  - wherein the data object comprises a compression region descriptor that specifies the contents of the first region and that is stored in a non-compressed second region that is distinct from the first region,
  - wherein the first region and the second region are both stored within a structure making up an entirety of the data object,
  - wherein the entirety of the data object including the first region and the second region is stored in a same one of the persistent storage, and
  - wherein the persistent storage further comprises a namespace that is stored together with the object storage on the persistent storage, wherein the namespace associates the files with a file recipe that is also stored in the persistent storage, wherein the file recipe is used to generate the files using the file segments stored in the first region of the data object, wherein the file recipe comprises information that enables the file segments stored in the first region of the data object to be retrieved from the data object, and wherein the persistent storage comprises the namespace instead of a file system; and
- storing, by the data management device, meta-data of the plurality of file segments in a meta-data object of the object storage that stores meta-data objects in an uncompressed format, wherein the meta-data objects each store aggregations of meta-data of the file segments of the files.

13. The method of claim 12, wherein generating, by the data management device, meta-data of the plurality of file segments comprising:
- generating, by the data management device, a fingerprint of a first file segment of the plurality of file segments;
- matching, by the data management device, the fingerprint to a second plurality of fingerprints stored in meta-data objects of the object storage;
- making, by the data management device, a determination that the fingerprint matches a fingerprint of the second plurality of fingerprints; and
- deleting, by the data management device, the first file segment based on the determination.

14. The method of claim 12, wherein storing, by the data management device, the portion of the plurality of file segments in the data object of the object storage comprises:
- adding, by the data management device, a first file segment of the plurality of file segments to the data object of the object storage;
- making, by the data management device, a determination that the data object is full based on the addition of the first file segment;
- in response to the determination, storing, by the data management device, the first data object in the object storage; and
- adding, by the data management device, a second file segment of the plurality of file segments to a second data object that is not full based on the first data object being stored in the object storage.

15. A non-transitory computer readable medium comprising computer readable program code, which when executed by a computer processor enables the computer processor to perform a method for operating a data management device, the method comprising:
- segmenting, by the data management device, a file into a plurality of file segments;
- generating, by the data management device, meta-data of the plurality of file segments;
- storing, by the data management device, a portion of the plurality of file segments in a data object of an object storage, wherein the object storage is stored in a persistent storage of the data management device, wherein the plurality of file segments is stored in a deduplicated and compressed format in a first region of the data object that is compressed, wherein the data object comprises a compression region descriptor that specifies the contents of the first region and that is stored in a non-compressed second region that is distinct from the first region, wherein the first region and the second region are both stored within a structure making up an entirety of the data object, wherein the entirety of the data object including the first region and the second region is stored in a same one of the persistent storage, and wherein the persistent storage further comprises a namespace that is stored together with the object storage on the persistent storage, wherein the namespace associates the files with a file recipe that is also stored in the persistent storage, wherein the file recipe is used to generate the files using the file segments stored in the first region of the data object, wherein the file recipe comprises information that enables the file segments stored in the first region of the data object to be retrieved from the data object, and wherein the persistent storage comprises the namespace instead of a file system; and; and storing, by the data management device, meta-data of the plurality of file segments in a meta-data object of the object storage that stores meta-data objects in an uncompressed format, wherein the meta-data objects each store aggregations of meta-data of the file segments of the files.

16. The non-transitory computer readable medium of claim 15, wherein generating, by the data management device, meta-data of the plurality of file segments comprises:

generating, by the data management device, a fingerprint of a first file segment of the plurality of file segments;

matching, by the data management device, the fingerprint to a second plurality of fingerprints stored in meta-data objects of the object storage;

making, by the data management device, a determination that the fingerprint matches a fingerprint of the second plurality of fingerprints; and deleting, by the data management device, the first file segment based on the determination.

17. The non-transitory computer readable medium of claim 15, wherein storing, by the data management device, the portion of the plurality of file segments in the data object of the object storage comprises:

adding, by the data management device, a first file segment of the plurality of file segments to the data object of the object storage;

making, by the data management device, a determination that the data object is full based on the addition of the first file segment;

in response to the determination, storing, by the data management device, the first data object in the object storage; and adding, by the data management device, a second file segment of the plurality of file segments to a second data object that is not full based on the first data object being stored in the object storage.

18. The management device of claim 1, wherein the first region is compressed using lossless compression.

* * * * *